United States Patent
Yu et al.

[19]
[11] Patent Number: 6,041,339
[45] Date of Patent: Mar. 21, 2000

[54] EFFICIENT DECIMATION FILTERING

[75] Inventors: Xianggang Yu; Terry Lee Sculley; Jeffrey Alan Niehaus, all of Austin, Tex.

[73] Assignee: ESS Technology, Inc., Austin, Tex.

[21] Appl. No.: 09/049,604

[22] Filed: Mar. 27, 1998

[51] Int. Cl.[7] ................................................. G06F 17/10
[52] U.S. Cl. .............................................................. 708/313
[58] Field of Search ..................................... 708/313, 319

[56] References Cited

U.S. PATENT DOCUMENTS

| | | | |
|---|---|---|---|
| 4,775,851 | 10/1988 | Borth | 341/155 |
| 5,027,306 | 6/1991 | Dattorro et al. | 708/313 |
| 5,051,981 | 9/1991 | Kline | 370/290 |
| 5,181,033 | 1/1993 | Yassa et al. | 341/143 |
| 5,191,334 | 3/1993 | Yasuda | 341/61 |
| 5,301,134 | 4/1994 | Maruyama | 708/313 |
| 5,317,529 | 5/1994 | Teraoka et al. | 708/313 |
| 5,329,553 | 7/1994 | Abbiate et al. | 375/247 |
| 5,410,498 | 4/1995 | Staver | 708/313 |
| 5,461,641 | 10/1995 | Abbiate et al. | 375/243 |
| 5,506,798 | 4/1996 | Shimada et al. | 708/315 |
| 5,512,895 | 4/1996 | Madden et al. | 341/61 |
| 5,590,065 | 12/1996 | Lin | 708/313 |
| 5,636,153 | 6/1997 | Ikegaya et al. | 708/313 |
| 5,751,615 | 5/1998 | Brown | 708/313 |

*Primary Examiner*—David H. Malzahn
*Attorney, Agent, or Firm*—Fish & Richardson P.C.

[57] ABSTRACT

A decimation filtering circuit for performing a decimation operation with a decimation factor of M in a pipelined structure. A finite impulse response ("FIR") filtering of N taps for achieving a desired frequency response is designed to have an integral ratio of N/M. A total of N/M processing stages is connected in series to accumulate filtered data based on data samples of an input signal and predetermined FIR coefficients. Each of the N/M processing stages produces an accumulated output in every other M accumulations for M input data samples.

50 Claims, 15 Drawing Sheets

FIG. 7A

ROM19: 7Fh h[0], 7Eh h[1], ... 01h h[126], 00h h[127]

ROM18: 7Fh h[128], 7Eh h[129], ... 01h h[256], 00h h[255]

ROM1: 7Fh h[2304], 7Eh h[2305], ... 01h h[2430], 00h h[2431]

ROM0: 7Fh h[2432], 7Eh h[2433], ... 01h h[2558], 00h h[2559]

FIG. 7B

| Addr | ROM0 | ROM1 | ROM2 | ROM3 | ROM4 |
|---|---|---|---|---|---|
| 1FFh | h[2432] | h[1920] | h[1408] | h[896] | h[384] |
| 1FEh | h[2304] | h[1792] | h[1280] | h[768] | h[256] |
| 1FDh | h[2176] | h[1664] | h[1152] | h[640] | h[128] |
| 1FCh | h[2048] | h[1536] | h[1024] | h[512] | h[000] |
| 1FBh | h[2433] | h[1921] | h[1409] | h[897] | h[385] |
| ... | ... | ... | ... | ... | ... |
| 004h | h[2174] | h[1662] | h[1150] | h[638] | h[126] |
| 003h | h[2559] | h[2047] | h[1535] | h[1023] | h[511] |
| 002h | h[2431] | h[1919] | h[1407] | h[895] | h[383] |
| 001h | h[2303] | h[1791] | h[1279] | h[767] | h[255] |
| 000h | h[2179] | h[1663] | h[1151] | h[639] | h[127] |

EFFICIENT DECIMATION FILTERING

FIELD OF THE INVENTION

The present invention relates to electronic signal processing, and more specifically, to digital decimation filtering.

BACKGROUND OF THE INVENTION

Sampling of analog signals is an essential step in digital signal processing. An analog signal is in general a function of time and can be represented by a plurality of digitized samples in time domain. The amplitude of each sample then can be quantized to a finite number of bits. This sample-and-quantization process converts an analog signal into digital format. Next, the digitized data can be processed by one or more digital signal processors and the resultant data may be converted back into analog form if needed.

An analog signal can be accurately represented by a stream of time samples only if the analog signal is band-limited to a maximum frequency and the samples are obtained at or above a Nyquist rate which is twice the maximum frequency. An analog prefilter is usually used to filter an input analog signal to limit the bandwidth. Such sampling generates multiple replicas of the band-limited analog signal in the frequency domain which are separated from one another by a frequency separation equal to the sampling frequency. Thus, the sampling frequency should be sufficiently large to ensure that two adjacent replicas do not overlap. At a given sampling frequency which is equal or greater than the Nyquist rate, the analog prefilter may need to have a sharp frequency fall-off profile which often requires expensive and bulky high-quality analog filters. Therefore, it may be advantageous to oversample the analog signal, i.e., at a sampling frequency higher than the Nyquist rate, in order to alleviate the need for high-quality analog prefilters.

Oversampling may also be used to improve the accuracy or precision of the analog-to-digital conversion by reducing the quantization noise. At a fixed sampling frequency, the accuracy of the analog-to-digital conversion can be increased by reducing the quantization step or increasing the quantization resolution. This reduces the quantization error. However, a high-resolution quantizer can be bulky and expensive. In addition, a high-resolution quantizer may be susceptible to a nonlinear response. Use of a high-resolution quantizer may be avoided by using oversampling in combination with a low-resolution quantizer to maintain a desired accuracy and to improve the circuit linearity. Although the accuracy of each sample is low, the increased number of samples due to the oversampling can be used to improve the overall accuracy. In essence, oversampling allows spreading the quantization noise over a wide frequency range. Since a signal frequency band at low frequencies only occupies a fraction of the wide frequency range, the quantization noise in the signal frequency band can be significantly reduced. The noise remaining in the signal band can be further reduced by a noise shaping technique to shift the frequency of the noise out of the signal band.

For example, analog-to-digital conversion based on the sigma-delta modulation uses a sigma-delta modulator to perform oversampling on an input analog signal at a high sampling rate and noise shaping on the sampled data. In addition, a decimation filter connected to the sigma-delta modulator performs a digital filtering process on the output samples to produce output digital data with an increased data bit length at a desired low sampling rate. This filtering process also attenuates the quantization noise at high frequencies caused by the noise shaping to reduce the noise in the downsampled output digital data.

In general, a decimation filtering circuit may be used in any device to convert an input digital signal of a high sampling rate into an output digital signal of a low sampling rate without losing the information content. The word length of the decimated data can be increased if needed to preserve the resolution. Such a decimation filtering circuit may be used in a number of applications such as modems and digital audio devices.

SUMMARY OF THE INVENTION

The described decimation filtering circuits perform a decimation operation with a decimation factor of M in a pipelined structure. A finite impulse response ("FIR") filtering of N taps for achieving a desired frequency response can be designed to make the ratio of N/M an integer. A total of N/M processing stages can be connected in series to accumulate filtered data based on data samples of an input signal and predetermined FIR coefficients. Each of the N/M processing stages produces an accumulated output in every other M accumulations for M input data samples.

One embodiment of the decimation filter includes an input terminal operable to receive a series of input data samples at an input sampling rate, at least one memory unit for storing the FIR coefficients, and a plurality of signal processing stages interconnected in series for shifting an accumulated result from one processing stage to a succeeding processing stage after a specified number of accumulations are completed in each processing stage in response to a shift command. Each processing stage is directly connected to the input terminal and the memory unit to receive an input data sample and a respective FIR coefficient for accumulation.

One implementation of a processing stage includes one multiplier operable to multiply an input data sample by a selected coefficient in the memory unit, one accumulator connected to receive data from the multiplier, one multiplexer having one input connected to the multiplier and another input connected to receive an input from a preceding processing stage or an external source, and one register connected to receive data from the multiplexer. An accumulation loop connects the register and the accumulator to feed data in the register to the accumulator for producing a subsequent accumulation result.

Another implementation reduces the number of accumulators by sharing one accumulator among a plurality of processing stages. Each accumulator is configured to have first and second input terminals to perform an accumulation operation on input data from the first and second input terminals to produce accumulated data.

At least two multiplexers and two registers are associated with each accumulator to effect two or more processing stages: a first multiplexer having a first input terminal connected to the accumulator to receive the accumulated data and a second input terminal to receive an external input data, a first register connected to receive data from the first multiplexer, a second multiplexer having first and second input terminals connected to receive data transmitted from the first register, a second register connected to receive data from the second multiplexer, and a signal channel connected to transmit data in the second register to the accumulator for accumulation.

The first and second multiplexers are preferably synchronized to either respectively route signals at the first terminals to the first and second registers or respectively route signals at the second terminals to the first and second registers. Each multiplexer ordinarily is configured to transmit a signal at the first input terminal to the output unless a shift command signal that controls all multiplexers instructs to route a signal at the second input terminal.

Sharing of an accumulator may also be implemented by switching the input and output terminals of the accumulator to multipliers and registers of different processing stages to sequentially perform accumulations on the same input data sample. A clock signal faster than the input sampling rate is used to control the switching. For example, an accumulator may be connected to switch among four different processing stages by switching the accumulator four times faster than the input sampling rate.

However implemented, the memory unit may be a single read-only memory ("ROM") in which a proper data pointing and retrieving mechanism is needed to feed the right coefficients to the right processing stages. Alternatively, the memory unit may include a plurality of ROMs respectively associated with the processing stages. The FIR coefficients may be allocated to different ROMs in such a way that each ROM only stores coefficients for accumulations in a respective processing stage.

These and other aspects and advantages associated with the described decimation circuits and techniques will become more apparent in light of the following detailed description, including the accompanying drawings and appended claims.

BRIEF DESCRIPTION OF THE DRAWINGS

FIGS. 7A and 7B show allocation of FIR coefficients in different ROM configurations.

DETAILED DESCRIPTION OF THE PREFERRED EMBODIMENTS

Figure 1:
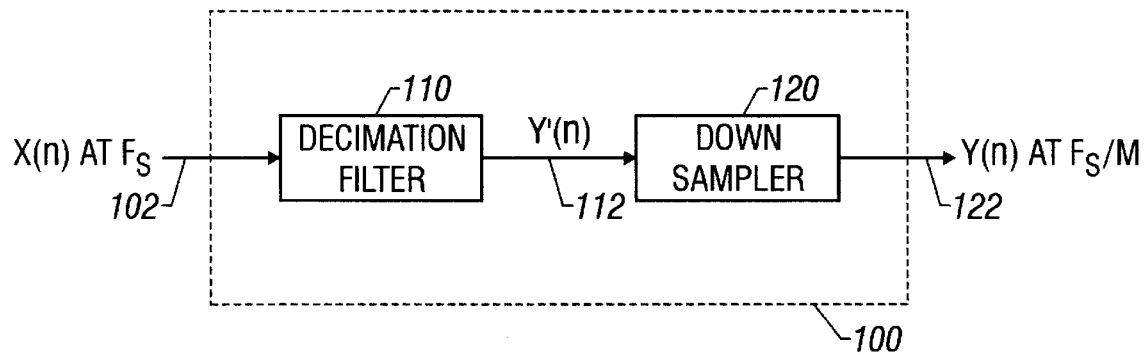
FIG. 1 is a block diagram showing general function blocks of a decimation circuit.

FIG. 1 shows general functional blocks of one embodiment 100 of the decimation filtering circuit. This circuit can be used in, for example, a delta-sigma modulator system. Time samples x(n) 102 at a sampling rate $f_s$ are fed into the decimation circuit 100 to produce output data y(n) at a reduced sampling rate, where n (=0, 1, 2, ...) represents the temporal sequence of the samples. A decimation filter 110 performs digital filtering on the input x(n) to generate filtered data y'(n) at the same sampling rate $f_s$. Next, a downsampler 120 resamples the filtered data y'(n) to reduce the sampling rate by a decimation factor of M ($\geq 2$). In many implementations as in the exemplary circuits described below, the decimation filter 110 and the down sampler 120 may not be separated circuits but are often physically integrated together.

The decimation filter 110 is in general a finite impulse response ("FIR") filter. The output of the FIR filter 110 of a length N ("N taps") at time n in response to the input x can be expressed as $$y'(n) = \sum_{i=0}^{N-1} x(n-i)h_i, \tag{1}$$

where $h_i$ are the impulse response coefficients, $h_0, h_1, h_2, \ldots$ and $h_{N-1}$. The coefficients $h_i$ are designed to achieve certain filtering characteristics such as attenuating quantization noise at high frequencies. This is well known in digital signal processing and many techniques may be used.

The coefficients $h_i$ of the filter 110 are preferably symmetric, i.e.:

$$h_i = h_{N-1-i}. \tag{2}$$

in order to achieve a linear phase response and to avoid phase distortion on the signal. For example, if the filter 110 has 4 taps that are symmetric, the filtered output y'(n) at time n=3 is $$y'(3) = x(3)h_0 + x(2)h_1 + x(1)h_1 + x(0)h_0. \tag{3}$$

Figure 2:
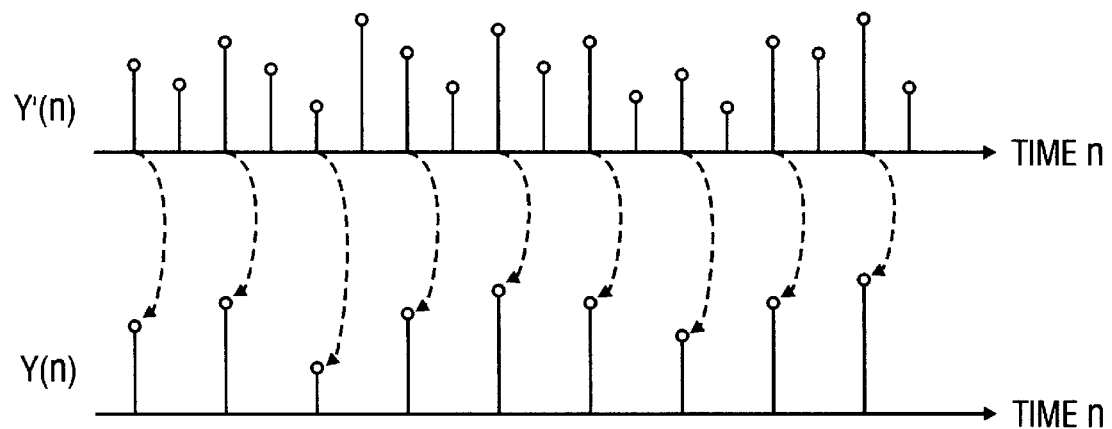
FIG. 2 is a diagram illustrating a down-sampling process with a decimation factor of 2.

The down sampler 120 selects one out of every M samples in the filtered y'(n) to produce the output y(n). Hence, the sampling rate of y(n) is reduced by a factor of M compared to x(n). This is illustrated by an example of down sampling in FIG. 2 where the decimation factor is M=2.

For a given decimation factor of M, only one out of every M output samples of the decimation filter 110 needs to be computed. Thus, the required minimum number of registers for the decimation circuit 100 to perform the decimation is N/M.

The ratio N/M is preferably an integer. If N/M is not an integer, zero-valued coefficients may be symmetrically introduced to either ends of the FIR filter to increase the filter length from N to N' such that N'/M is an integer. More preferably, a FIR filter can be designed to make N/M an integer for a desired M.

Table 1 shows how the decimation is performed in the decimation circuit 100 which has N=4 taps with FIR filtering coefficients $h_0$, $h_1$, $h_2$, and $h_3$ and a decimation factor of M=2. The input x(n) is zero for n<0. Values of y'(n) and y(n) in Table 1 are given by multiplying each cell by a respective FIR coefficient and then adding the corresponding products in a respective row. For example, y(0) is $x(1)h_0 + x(0)h_1$, and y'(2) is $x(2)h_0 + x(1)h_1 + x(0)h_2$, etc.

TABLE 1

N = 4, M = 2

| | $h_0$ | $h_1$ | $h_2$ | $h_3$ | y'(n) | y(n) |
|---|---|---|---|---|---|---|
| n = -1 | 0 | 0 | 0 | 0 | y'(-1) | y(-1) |
| n = 0 | x(0) | 0 | 0 | 0 | y'(0) | drop |
| n = 1 | x(1) | x(0) | 0 | 0 | y'(1) | y(0) |
| n = 2 | x(2) | x(1) | x(0) | 0 | y'(2) | drop |
| n = 3 | x(3) | x(2) | x(1) | x(0) | y'(3) | y(1) |
| n = 4 | x(4) | x(3) | x(2) | x(1) | y'(4) | drop |
| n = 5 | x(5) | x(4) | x(3) | x(2) | y'(5) | y(2) |

Figure 3A:
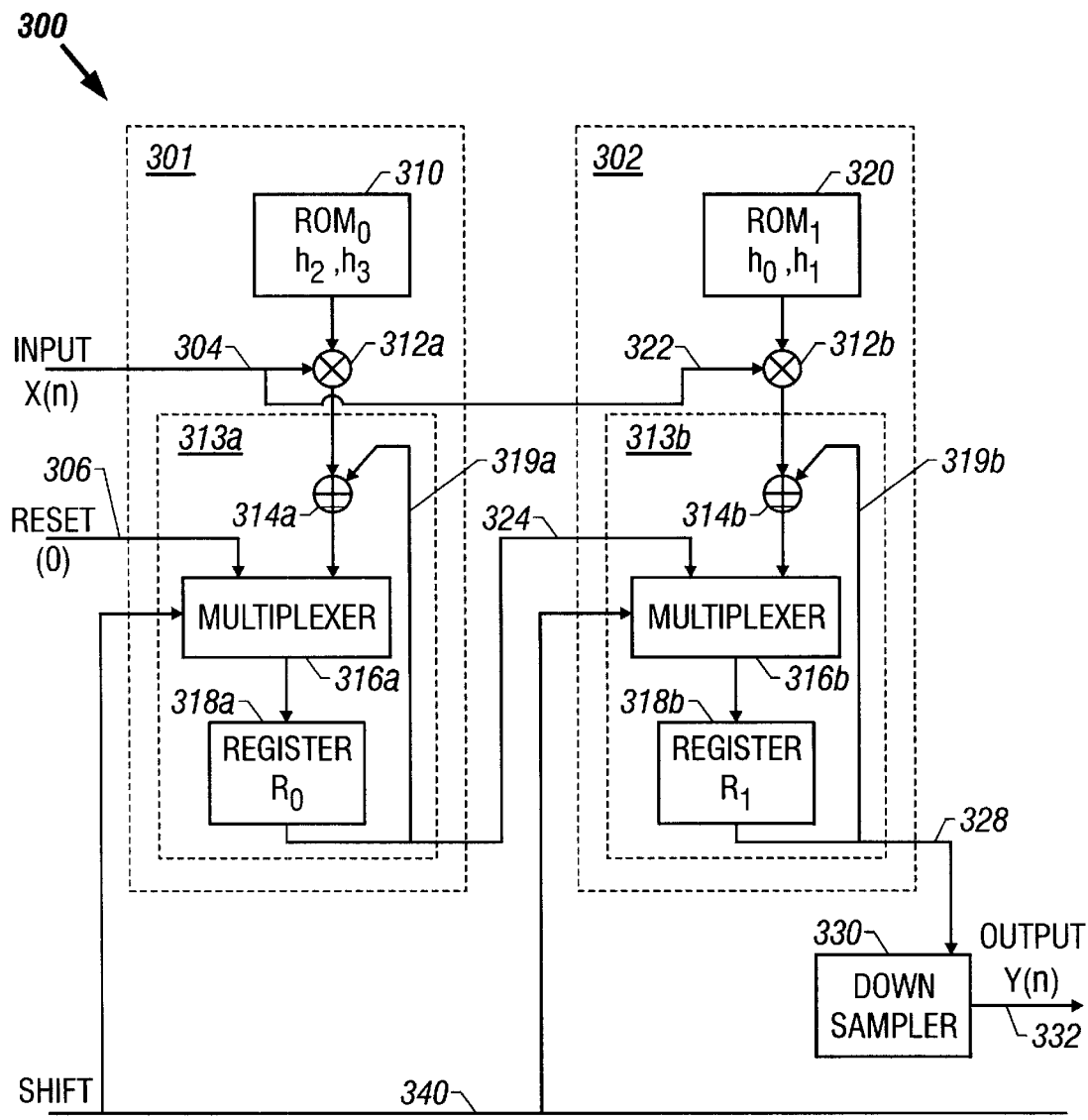
FIG. 3A is a block diagram of a decimation circuit with N=4 taps and a decimation factor of M=2.

FIG. 3A shows a decimation circuit 300 that implements the decimation operation in Table 1. Since N=4 and M=2, a minimum number of registers required is N/M=2. The decimation circuit 300 includes two similarly constructed signal processing stages 301 and 302 each having a ROM for storing filtering coefficients, a multiplier, and an adder/register ring. Different stages are constructed and connected to perform accumulations based on the same input data samples but with different FIR coefficients in parallel. These stages (i.e., 301 and 302) are further connected in series by a channel 324 such that the data in the register 318a can be shifted to the second stage 302 after a certain number of accumulations in each stage. The output 328 of the second register 318b is sampled by a down sampler 330 every time when the data in the first register 318a is shifted to the second stage 302 to produce the decimated output y(n) 332. Thus, the decimation operation is carried out by different stages in a pipelined configuration. A shift signal 340 is used to synchronize the multiplexers 316a, 316b and the down sampler 330. For sake of simplicity, a corresponding control logic circuit is not shown in FIG. 3A.

The signal processing stage 301 includes a first read-only-memory ("ROM") 310, a first multiplier 312a, and a first adder/register ring 313a formed by a first adder 314a, a first multiplexer 316a and the first register 318a. Similarly, the signal processing stage 302 includes a second read-only-memory ("ROM") 320, a second multiplier 312b, a second adder/register ring 313b formed by a second adder 314b, a second multiplexer 316b and a second register 318b. An input terminal 304 is connected to the multipliers 312a and 312b in such a way that an input x(n) is fed to both multipliers 312a and 312b in parallel.

The ROMs 310 and 320 respectively store the FIR filter coefficients $h_2$, $h_3$ and $h_0$, $h_1$. Alternatively, a single ROM may be used to store all 4 coefficients with proper data pointing and retrieving mechanism to feed the coefficients $h_2$, $h_3$ to the multiplier 312a and the coefficients $h_0$, $h_1$ to the multiplier 312b, respectively. When the coefficients $h_0$, $h_1$, $h_2$, and $h_3$ are symmetric as in Equation (2), the size of the ROMs 310 and 320 can be reduced by one half since each ROM only needs to store one coefficient instead of two.

The adder/register rings 313a, 313b each have an adder (314a or 314b) to accumulate input data from the respective multiplier (312a or 312b) and the data from a feedback loop (319a or 319b) that connects the respective register (319a or 319b) and adder. The multiplexers 316a and 316b are each connected between the respective adder (314a or 314b) and register (318a or 318b) to either route the output of the adder to the register for performing accumulation or shift an external input or an accumulated result from a preceding stage into the register for subsequent accumulations.

A shift operation occurs in every other M clock cycles when M accumulations in each stage are completed. FIG. 3A shows an example of M=2. The data in the register of one stage is shifted out to the register of a subsequent stage while the data in the register of a preceding stage is shifted in so that the subsequent M accumulations are based on this shifted data. For the first processing stage such as the stage 301, a zero-value is shifted into the register (e.g., 318a) from a reset input 306 to reset the register in each shift operation. For the last processing state such as the stage 302, the data in the register (e.g., 318b) is sampled by the down sampler 330 to produce an output 332 in each shift operation. A total of (N/M) stages each perform M accumulations in order to produce an output sample from the down sampler 330. Thus, each output sample includes the result of N accumulations performed in M clock cycles.

The decimation filter 300 in FIG. 3A requires one extra clock cycle for shifting data out of each register and resetting the register (e.g., 318a) in the first processing stage (e.g., 301). No input data in the x(n) should occur during this extra clock cycle. One way to implement this, for example, is to control the accumulators 314a, 314b and the registers 318a, 318b at a clock rate twice as fast the sampling rate of the input data x(n) so that the accumulators 314a, 314b receive a new input data every other clock cycle. Thus, a new accumulation with a new input data is actually performed by each accumulator every other clock cycle. The shift and reset operations are carried out in clock cycles during which no new data enters the circuit.

Figure 3B:
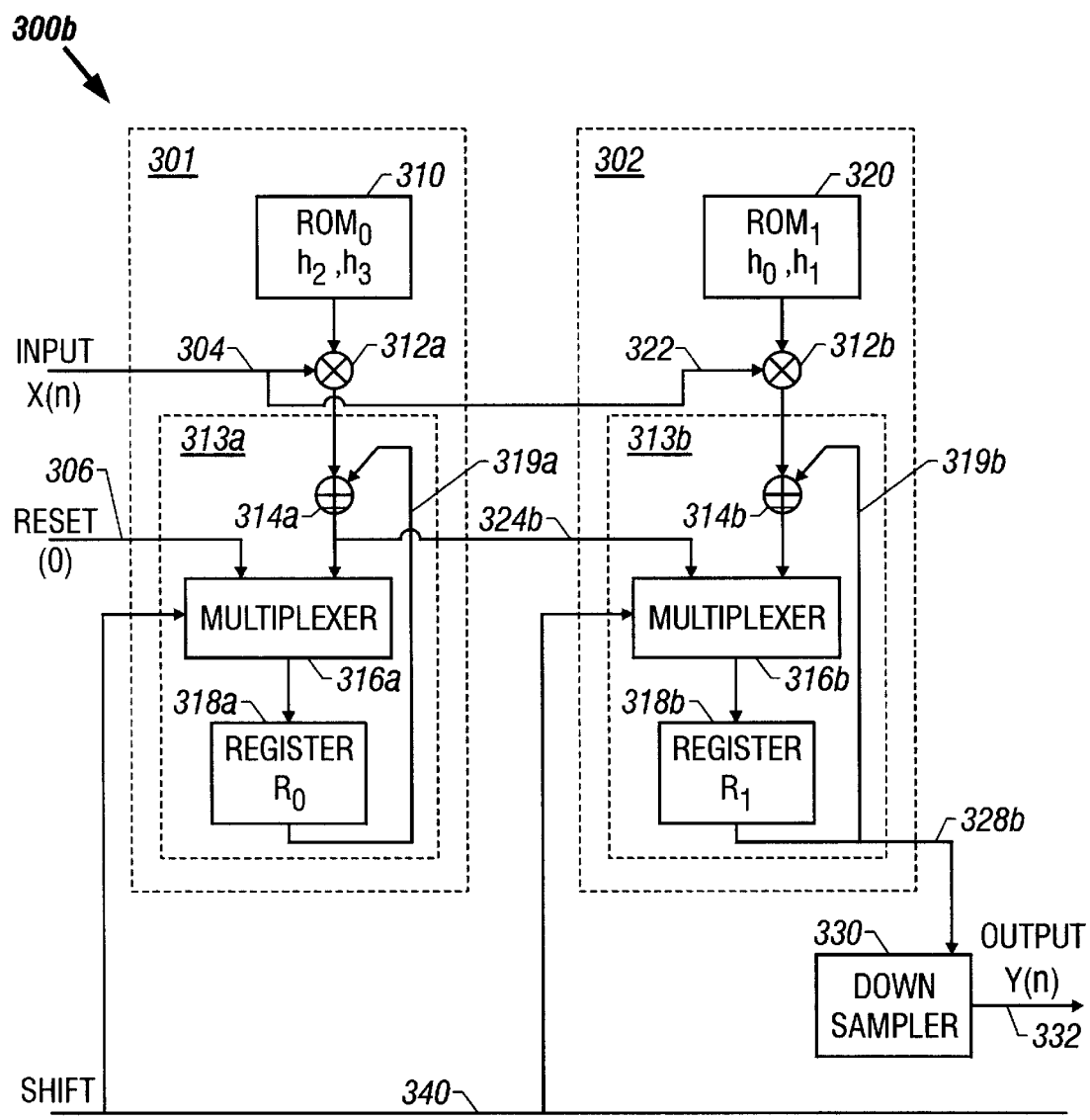
FIG. 3B is a block diagram of another decimation circuit with N=4 taps and a decimation factor of M=2.

The above extra clock cycle for shifting and resetting for every M accumulations may be eliminated by directly exporting the accumulation results of each processing stage from the output terminal of the respective accumulator rather than the register. FIG. 3B shows this configuration in a decimation filter 300b. The output terminals of the accumulators 314a and 314b are connected to one input of the multiplexer 316b by a channel 324b and the input of the down sampler 330 by a channel 328b, respectively. In this configuration, the shifting and resetting operations can be performed along with an accumulation in a single clock cycle.

Figure 3C:
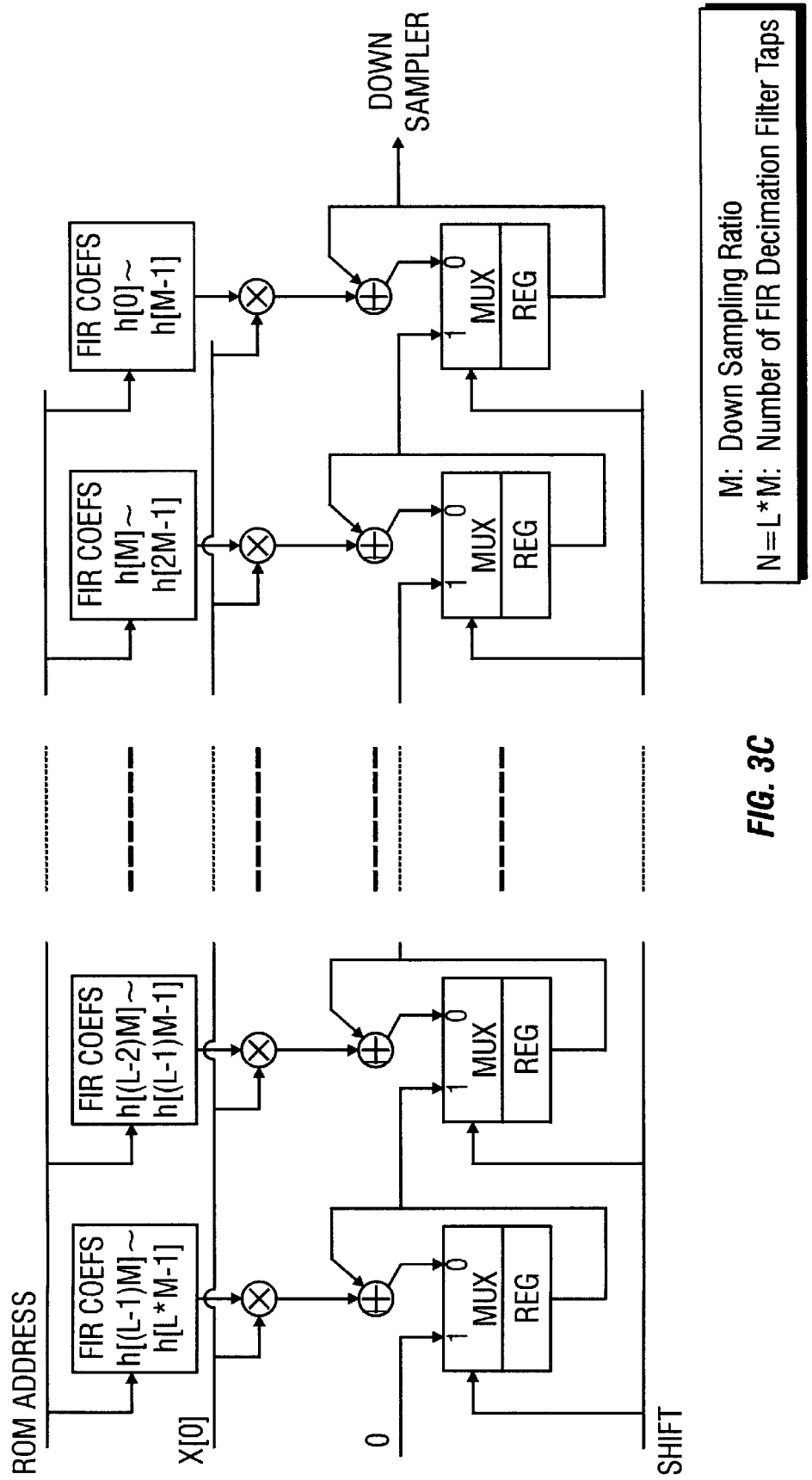
FIG. 3C is a block diagram of a decimation circuit with more than two pipelined processing stages based on the design in FIG. 3A.
Figure 3D:
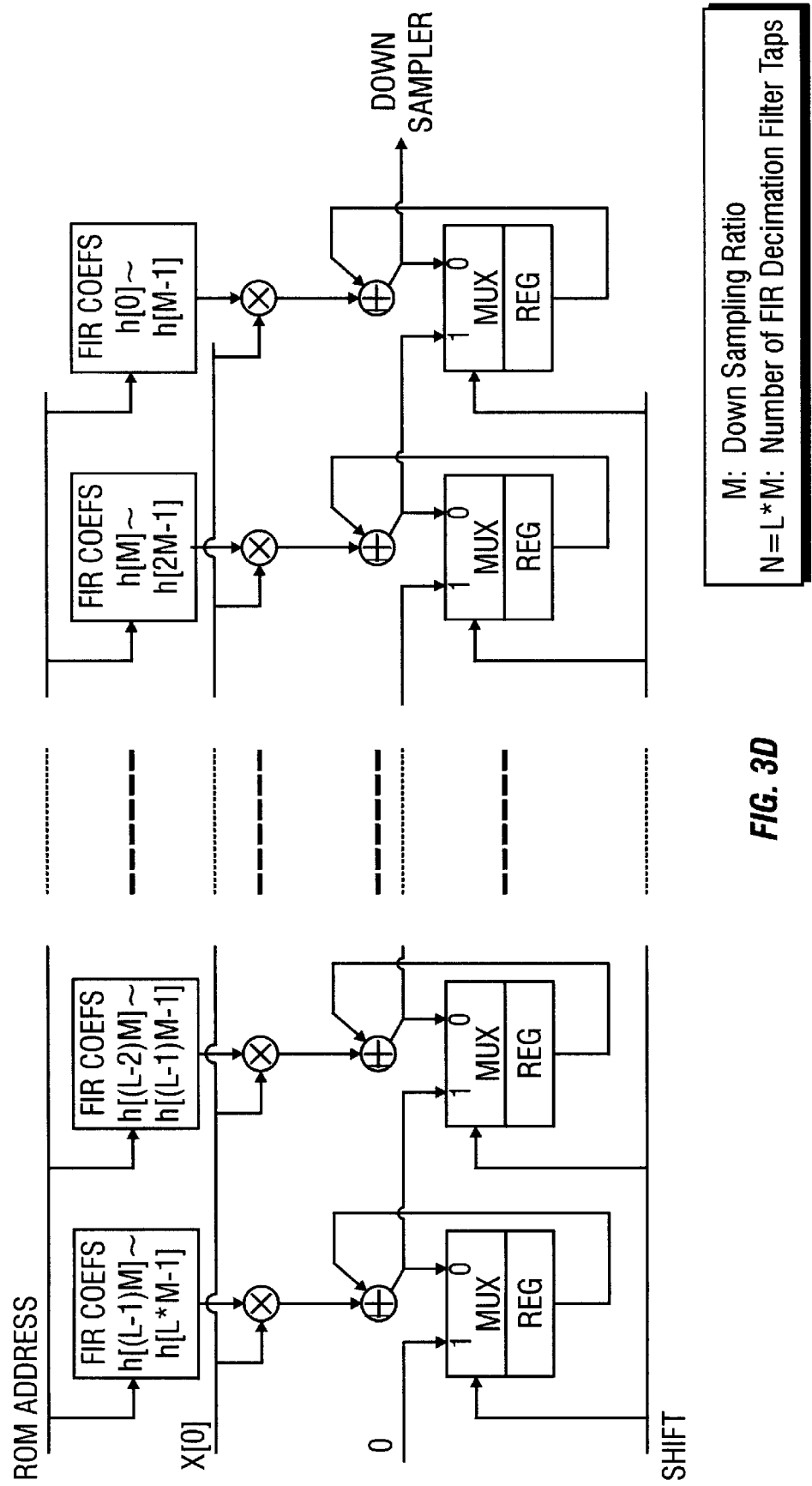
FIG. 3D is a block diagram of a decimation circuit with more than two pipelined processing stages based on the design in FIG. 3B.

The above decimation circuits 300 of FIG. 3A and 300b of FIG. 3B can be applied to any number of taps N and any decimation factor of M. FIGS. 3C and 3D respectively show two exemplary filters with more than two pipelined processing stages. The minimum number of stages and registers is N/M. Each ROM can be configured to store M coefficients. The FIR filter coefficients $h_i$ may be chosen to generate a desired frequency response for a specific application. In general, the coefficients $h_i$ are constructed to remove high frequency components of the input signal x(n), which may otherwise be aliased into the signal band by down sampling. In sigma-delta analog-to-digital converters, such a decimation circuit is used to attenuate high-frequency quantization noise.

Figure 4:
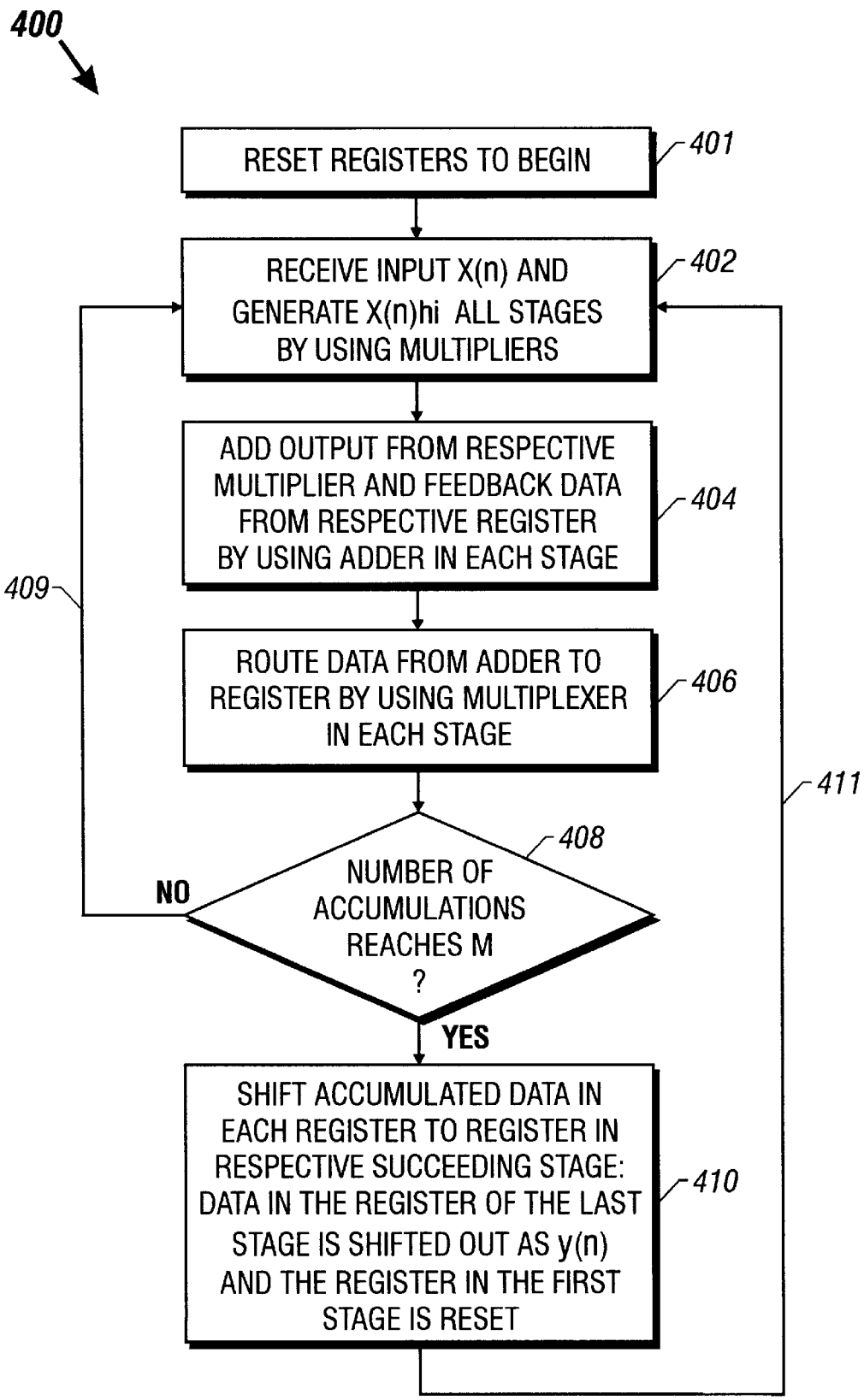
FIG. 4 is a flowchart showing the operation of a decimation circuit with N/M registers.

The decimation filters shown in FIGS. 3A–3D operate in a similar fashion except that the filters in FIGS. 3A and 3C need designed clock cycles for shifting and resetting operations. FIG. 4 is a flowchart 400 showing a preferred operation procedure.

The following describes the decimation operation with a specific reference to the circuit 300 in FIG. 3A. At step 401, all registers (e.g., 318a and 318b) are reset to zero before processing input x(n). At n=0, the coefficient $h_3$ is fetched from the ROM 310 and multiplied by x(0) in the multiplier 312a while $h_1$ is fetched from the ROM 320 and multiplied by x(0) in the multiplier 312b (step 402). At step 404, each adder adds the output from the respective multiplier and the accumulated result in the register within the processing stage. Since both registers 318a and 318b are empty at this time, the outputs of the adders 314a, 314b are equal to the outputs of the multipliers 312a, 312b, respectively. The multiplexers route the outputs from the adders to respective registers (step 406). This completes one accumulation. A control logic then determines whether the number of accumulations has reached the decimation factor M at step 408. Since M=2 in this example, the circuit continues to accumulate as indicated by loop 409.

At n=1, the coefficient $h_2$ is fetched from the ROM 310 and multiplied by x(1) in the multiplier 312a while $h_0$ is fetched from the ROM 320 and multiplied by x(1) in the multiplier 312b (step 402). The adder 314a adds the output $x(1)h_2$ from the multiplier 312a and $x(0)h_3$ from the register 318a to produce $x(0) h_3+x(1)h_2$ (step 404). The result $x(0) h_3+x(1)h_2$ is then fed into the register 318a (step 406). At the same time, the adder 314b adds the output $x(1)h_0$ from the multiplier 312b and $x(0)h_3$ from the register 318b to produce $x(0)h_1+x(1)h_0$ (step 404). The result $x(0)h_1+x(1)h_0$ is fed into the register 318b (step 406).

Further, at n=1, two accumulations have been performed in each processing stage. This is equal to the decimation factor M=2. The control logic instructs the circuit to carry out a shift operation and a reset operation represented by step 410. Specifically, the result in the register 318b, $x(0) h_1+x(1)h_0$, is shifted out and sampled as the output y(0) while the multiplexer 316b routes the result in the register 318a to the register 318b. The zero input at the input terminal 306 is routed by the multiplexer 316a to reset the register 318a. The circuit 300 in FIG. 3A needs an extra clock cycle to perform the shifting and resetting. In the circuits shown in FIGS. 3B and 3D, the last cycle (i.e., the Mth) in a block of M cycles completes two operations: one accumulation and a shift operation (including the reset operation).

The above accumulation and shift process is repeated to produce y(1), y(2), etc. as indicated by the loop 411. Table 2 shows the values of registers 318a, 318b and the output y(n) for n=0, 1, 2, and 3.

One way of achieving this is to use a master clock that is faster than the rate of the input x(n). Assume the master clock is faster than the data rate of x(n) by a factor of m, a single adder can be controlled to perform m accumulations during one sampling period of the input x(n). Therefore, one adder can be shared by m registers of m processing stages. The decimation circuit 500 implements the above sharing of adders by using a master clock 516 at about 24 MHZ (e.g., a crystal oscillator of 24.576 MHZ). Since the oversampling rate of the input x(n) is 128×48 kHz≈6 MHZ, 4 registers can share one adder so that only a total of 20/4=5 adders are actually needed to implement 20 processing stages.

Figure 5:
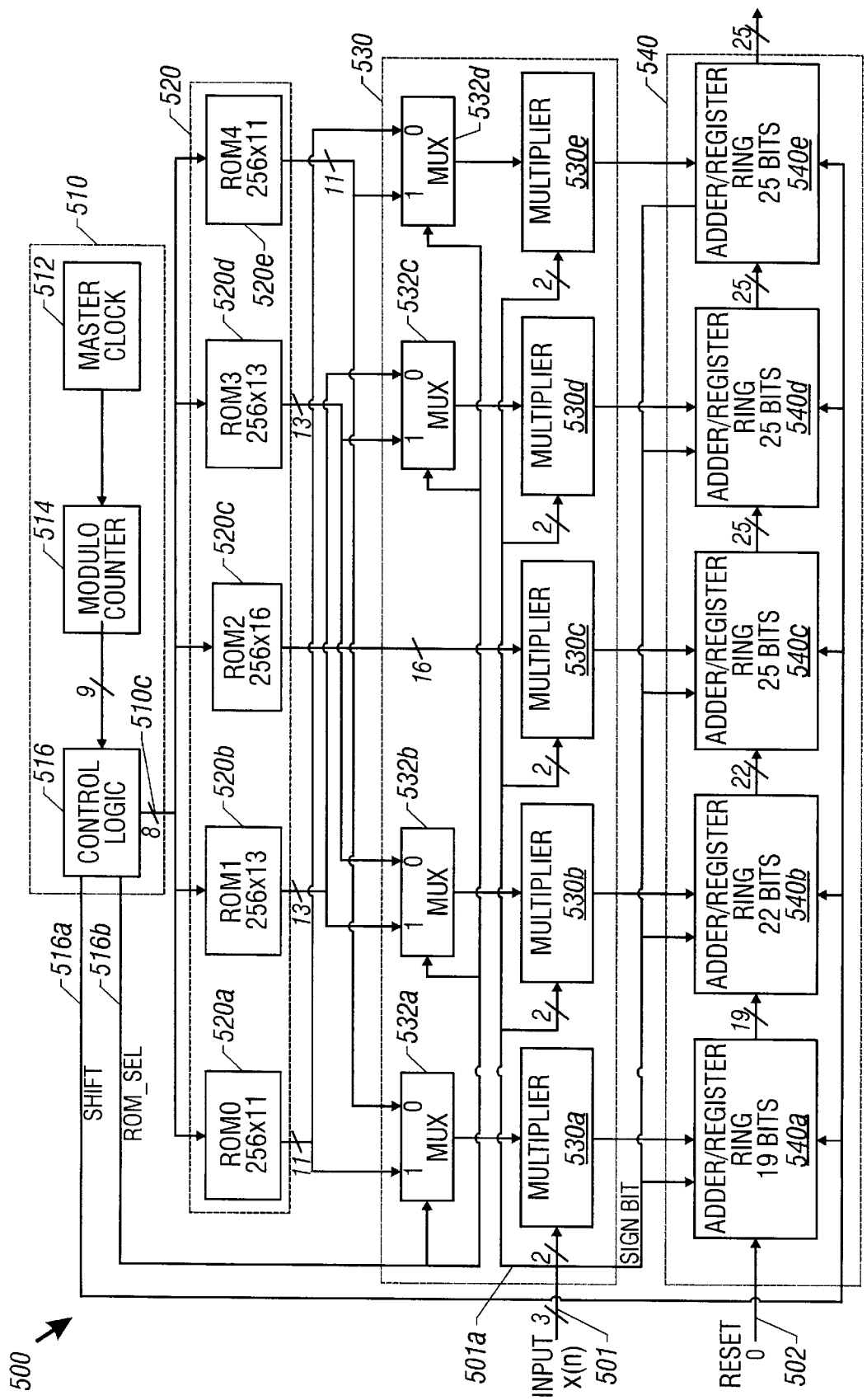
FIG. 5 is a block diagram of one decimation circuit in accordance with one embodiment of the invention.

Referring to FIG. 5, the circuit 500 has a control module 510 for providing shift control signals and ROM selection signals based on a master clock 512 at about 24 MHZ, a ROM block 520 with 5 ROMs for storing FIR filter coefficients $h_i$, a multiplier block 530 which fetches desired filter coefficients to produce desired $x(n)h_i$ and an adder/register block 540 which produces an output 503 which is sampled by a down sampler to generate y(n). The circuit 500 has 5 signal processing stages. As will be described below, each processing stage effectively functions as 4 processing stages due to sharing of an adder by 4 registers. Thus, the effective processing stages are still 20 as required by the architecture shown in FIGS. 3A–3D.

The above 2560-tap FIR filtering has 1280 independent coefficients due to the symmetry required by the linear phase response. Each of 5 ROMs 520a, 520b, 520c, 520d, and 520e in the ROM block 520 stores 256 allocated FIR filtering coefficients. In general, an increase in the signal-to-noise ratio requires a corresponding increase in the bit size of each FIR coefficient. In practical implementations, the bit size of each coefficient is set small or minimized to maintain the signal-to-noise ratio at or above a desired level. In the example shown in FIG. 5 for converting the 3-bit input x(n) 501 at about 6 MHZ into 25-bit output y(n) at 48 kHz, the coefficients in the ROMs 520a and 520e are 11 bits, the coefficients in the ROMS 520b and 520d are 13 bits, and the coefficients in the ROM 520c are 16 bits.

TABLE 2

| n | Register 318a | Register 318b | Output y (n) |
|---|---|---|---|
| 0 | $x (0) h_3$ | $x (0) h_1$ | |
| 1 | $x (0) h_3 + x (1) h_2$ | $x (0) h_1 + x (1) h_0$ | |
| shift/reset | 0 | $x (0) h_3 + x (1) h_2$ | $x (0) h_1 + x (1) h_0$ |
| 2 | $x (2) h_3$ | $x (0) h_3 + x (1) h_2 + x (2) h_1$ | |
| 3 | $x (2) h_3 + x (3) h_2$ | $x (0) h_3 + x (1) h_2 + x (2) h_1 + x (3) h_0$ | |
| shift/reset | 0 | $x (2) h_3 + x (3) h_2$ | $x (0) h_3 + x (1) h_2 + x (2) h_1 + x (3) h_0$ |

FIG. 5 shows an exemplary decimation circuit 500 based on the operation and architecture of the circuits in FIGS. 3A–3D. As an example, it is assumed that the input samples x(n) are 128-times oversampled 3-bit code symbols {-2,-1,0,1,2} at a sampling rate of 128×48 kHz and the circuit 500 operates based on a 2560-tap FIR filter to produce output data y(n) of 25 bits at 48 kHz.

Since N=2560 and M=128, the minimum number of registers is N/M=2560/128=20. According to the circuit architecture shown in FIG. 3A, the decimation operation requires a total of 20 signal processing stages each having an adder. However, the number of the adders may be reduced from N/M=20 by sharing one adder among multiple registers in multiple processing stages. This simplifies the structure of the decimation circuit by reducing adders and saves die space in VLSI implementations.

Figure 5A:
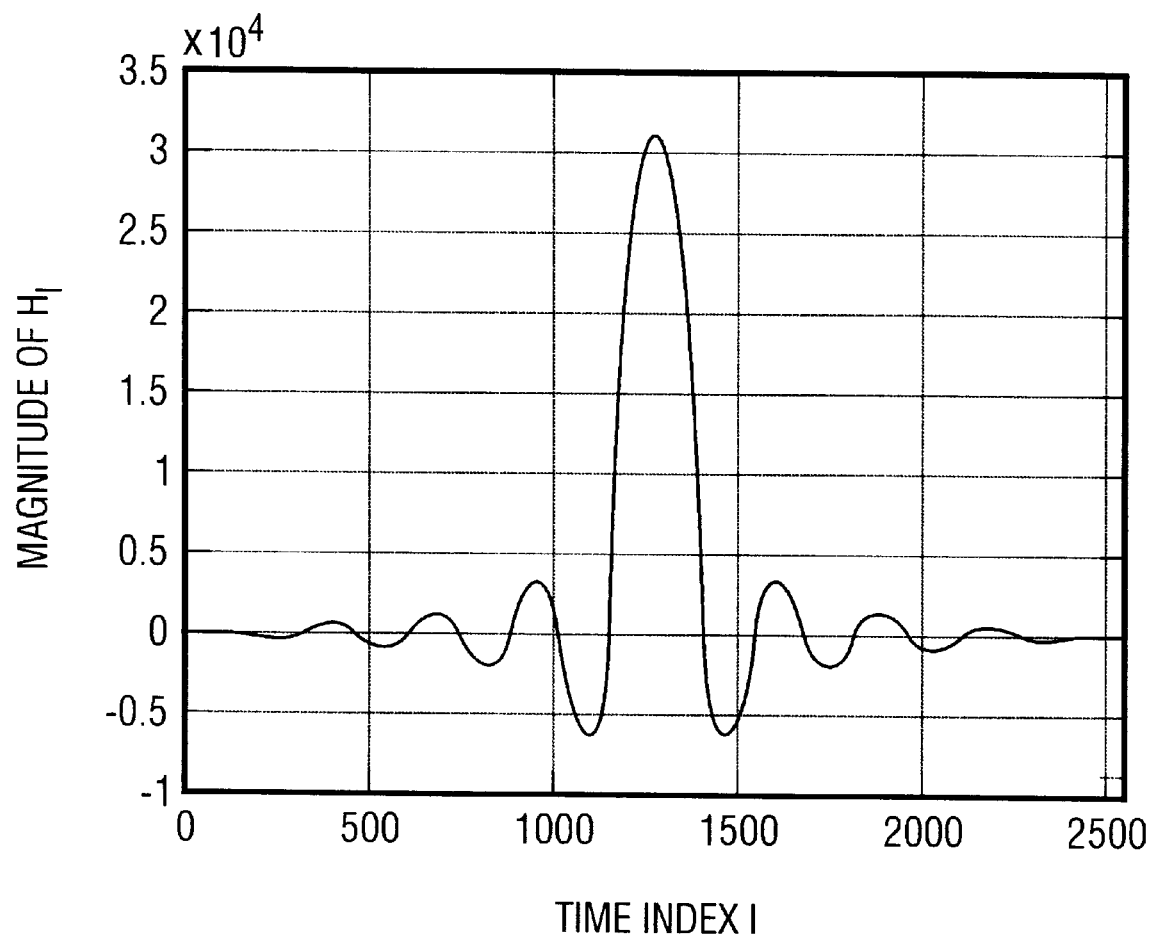
FIG. 5A is a plot showing exemplary quantized and scaled FIR coefficients for the circuit in FIG. 5.

FIG. 5A shows the FIR coefficients for the circuit 500. The vertical axis represents the magnitude of the coefficients and the horizontal axis represents the coefficient index i (i=0, 1, 2, . . . ). The coefficients are scaled and quantized to accommodate for conversion from 3-bit input data to 25-bit output data.

The multiplier block 530 includes 5 multipliers 530a, 530b, 530c, 530d, 530e to multiply each of the input samples x(n) by a proper coefficient $h_i$ and four 2-to-1 multiplexers 532a, 532b, 532c, and 532d for routing proper coefficients $h_i$ in the ROMs 520a, 520b, 520d and 520e to the proper multipliers. The control module 510 generates a ROM_SEL signal 510b to control the multiplexers 532a, 532b, 532c, and 532d which select ROMs 520a, 520b, 520d, and 520e.

Each of the multipliers 530a–530e may be implemented by using a shifter. Depending on the structure of the input data, a multiplication may be carried out by a simple shift operation. Since the possible values of the input 3-bit data are −2, −1, 0, 1, and 2, a shifter can perform the desired multiplications of x(n)hi by shifting a coefficient to a proper position in the shifter. Such implementation can save die space since a shifter is simpler than a multiplier. Other implementations of the multipliers may also be possible.

The adder/register block 540 has 5 adder/register rings 540a, 540b, 540c, 540d, 540e. Each adder/register ring has one adder and 4 registers and is configured to accumulate M=128 outputs from a respective multiplier in the multiplier block 530. Each sample in the 3-bit input x(n) at the input node 501 is separated into a 2-bit signal 501a as one input to the multipliers and a sign bit 501b. The sign bit 501b is routed to each adder/register ring for controlling the adder in each adder/register ring to perform either addition or subtraction. The 2-bit data 501a is routed to all the multipliers in parallel.

For every other M=128 input sampling cycles, each adder/register ring moves the accumulated result to a succeeding adder/register ring and receives the accumulated result from a preceding adder/register ring. This is controlled by a SHIFT signal 510a from a control logic 516 in the control module 510. At the end of every other M=128 input sampling cycles, the first register in the first adder/register ring 540a that connects to a reset input 502 is reset to zero and the last register connected to the output terminal 503 in the adder/register ring 540e sends out one output.

Figure 6:
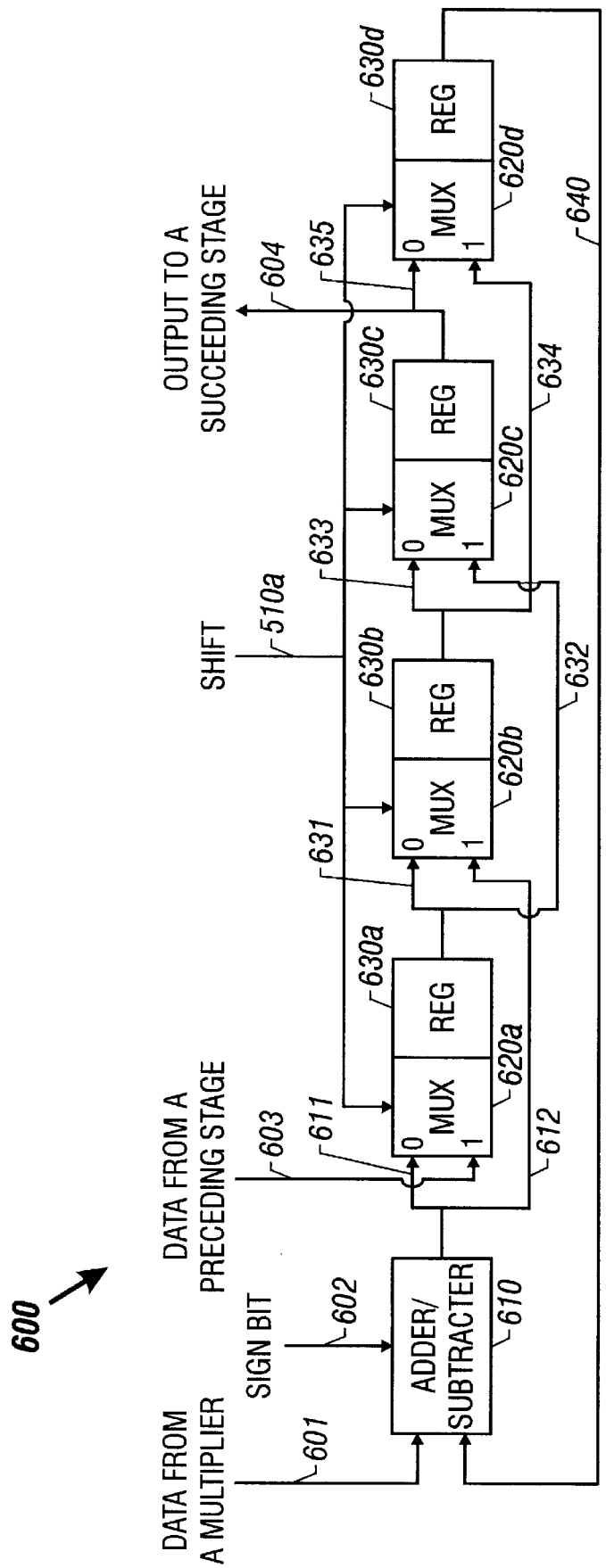
FIG. 6 is a block diagram of one adder/register ring circuit in which multiple registers share one accumulator.

FIG. 6 shows one embodiment 600 of the circuit common to all adder/register rings 540a, 540b, 540c, 540d, and 540e in the circuit 500. One accumulator 610, 4 multiplexers 620a, 620b, 620c, 620d and 4 registers 630a, 630b, 630c, 630d are connected to effect 4 signal processing stages in which the stage level increases by one sequentially from 630a to 630d. The circuit 500 uses 5 such adder/register rings to effect 20 processing stages in pipeline.

The accumulator 610 is configured to perform either addition or subtraction of the data in the register 630d from a channel 640 and the data from a respective multiplier based on the sign bit on a terminal 602 from the input x(n). The output of the accumulator 610 is routed to the multiplexer 620a through a channel 611 and the multiplexer 620b through a channel 612. The multiplexer 620a is also connected to an output of a preceding adder/register ring through a channel 603. The output terminals of the registers 630a and 630b are similarly connected to multiplexers 620b, 620c and 620c, 620d, respectively. The output of the register 630c, however, is connected to a respective succeeding adder/register ring through a channel 604 in addition to a connection to the multiplexer 620d.

The multiplexers 620a, 620b, 620c and 620d respectively control inputs to registers 630a, 630b, 630c, and 630d according to the shift signal 510a so that the multiplexers 620a–620d select data from channels 611, 631, 633, and 635 in an accumulation and select data from channels 603, 612, 632, and 634 in a shift operation.

In operation, the initial data from the highest-level register 630d is accumulated by the accumulator 610 first and then the data in registers 630c, 630b, and 630a is sequentially transmitted to the accumulator 610 through channels 640, 635, 633, and 631 and accumulated. After 4 clock cycles of the master clock 512 which occur within one input sampling cycle, 4 accumulations are completed to respectively produce 4 new results. The accumulated data based on the initial data in the register 630d is transmitted to the register 630c after 3 clock cycles. This accumulation continues until the accumulator performs 4×M=4×128=512 accumulations. At this time, a shift operation is initiated by the shift signal 510a, the accumulated data in the register 630c is shifted into the next identical adder/register ring and a new data is shifted into the lowest-level register 630a by the multiplexer 620a.

Therefore, the function of the circuit 600 is to effect four pipelined processing stages in the configurations shown in FIGS. 3A–3D. In general, one accumulator 610 may be shared by any number of registers using the architecture shown in FIG. 6 with proper clocking signals. The routing of data in the adder/register rings and in the circuit 500 may appear to be more complicated than that of the circuits of FIGS. 3A–3D due to the sharing of adders. However, the basic operation essentially remains the same and the flowchart 400 of FIG. 4 still applies.

Referring to FIG. 5, 5 ROMs are used to provide coefficients to 5 adder/register rings to effect 20 pipelined processing stages. The following describes how the 2560 FIR coefficients are arranged in the 5 ROMs to reduce the size of the ROMs, thus saving die area.

When 20 ROMs are used for the 20 pipelined processing stages, each ROM has 128 coefficients. FIG. 7A is a diagram showing the allocation of the 2560 coefficients in the ROMs (ROM0', ROM1', . . . , ROM19') and the sequence of each 128-coefficient block in each ROM. The hexadecimal numbers on the left side of each ROM represent the addresses of the coefficients. A 7-bit circular counter may be used to generate the hexadecimal numbers starting at 000h. To accommodate the adder/register ring 600 of FIG. 6 in which 4 registers share one adder, the circuit 500 of FIG. 5 uses 5 512-coefficient ROMs to store the 2560 coefficients with each ROM corresponding to four 128-coefficient ROMs shown in FIG. 7A.

FIG. 7B shows how the 2560 coefficients in 20 128-coefficient ROMs as in FIG. 7A are stored in 5 512-coefficient ROMs (ROM0, ROM1, ROM2, ROM3, ROM4). Each adder/register ring is designated with one ROM. The specific sequence of filling the 512-coefficient ROMs has a reverse imaging property as described below.

Since the FIR coefficients are symmetric, i.e., $h_i = h_{N-1-i}$, one half of the 2560 coefficients can be eliminated to reduce the required memory. In the 512-coefficient ROMs, the upper half of ROM0 is identical to the lower half of ROM4 in a reverse order and the lower half of ROM0 is identical to the upper half of ROM4 in a reverse order. This reverse imaging relation also applies to ROM1 and ROM3. For ROM2, the upper half is identical to the lower half in a reverse order. Hence, only one half of the 512 coefficients in each ROM (e.g., the lower half in ROM0) is needed and the other half (e.g., the upper half in ROM0) can be obtained by using coefficients in a corresponding half in another reversely imaged ROM (e.g., the lower half in ROM4). The 512 addresses of each ROM are still available even though each ROM only has 256 addresses.

Figure 8:
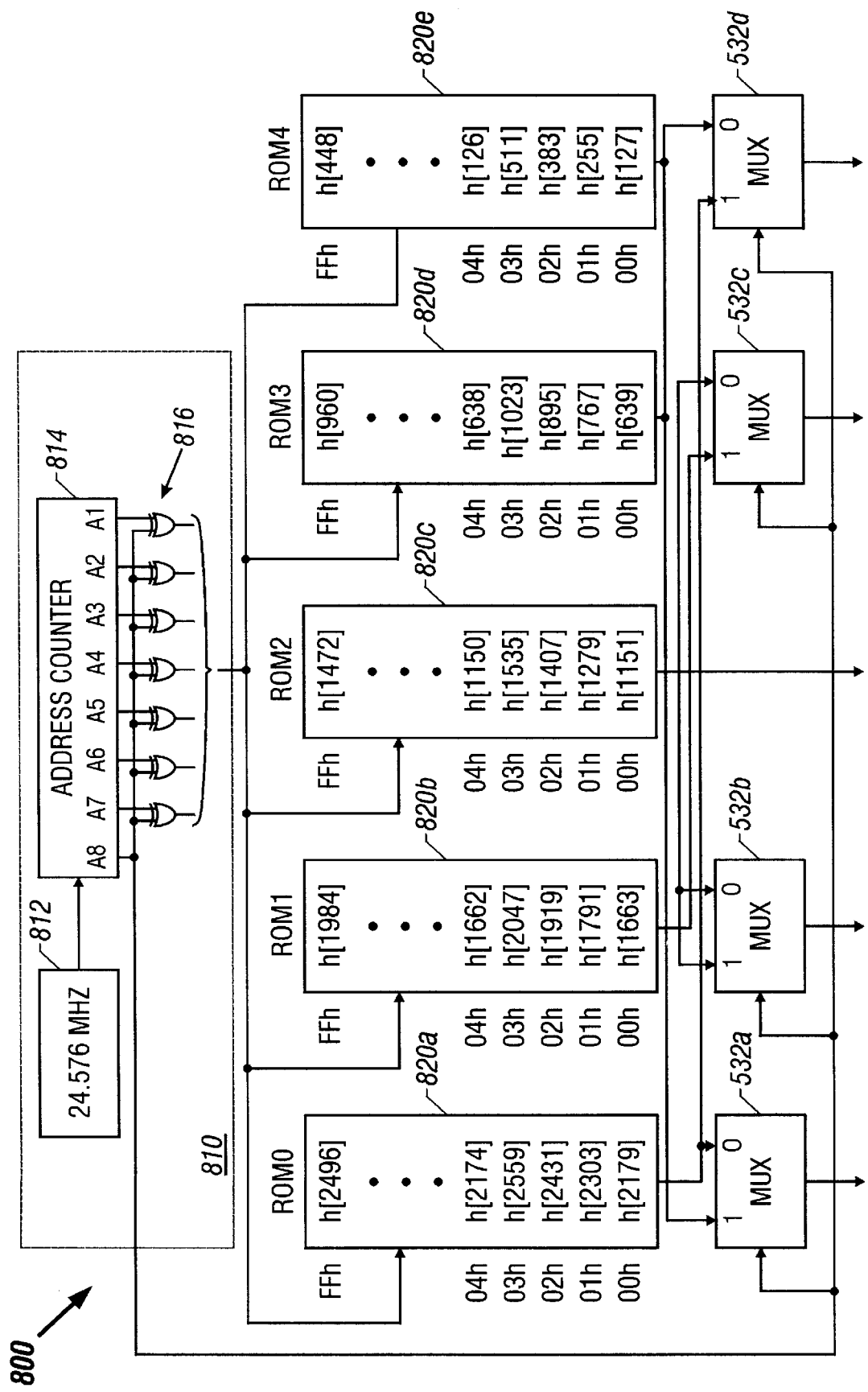
FIG. 8 is a diagram showing one implementation of allocating and routing FIR coefficients.

FIG. 8 shows a circuit 800 that implements the above sharing of the ROMs and the coefficient arrangement based on the circuit 500 of FIG. 5. Five ROMs 820a, 820b, 820c, 820d, and 820e each having 256 coefficients are used. Only the lower halves of the 512-coefficient ROMs in FIG. 7B are kept and the upper halves are eliminated due to the symmetry. In this configuration, the first multiplier 530a and adder/register ring 540a need coefficients from both ROM 820a and ROM 820e to perform the decimation operation. Therefore, the multiplexer 532a are connected to both ROMs 820a and 820e to fetch the FIR coefficients as needed. The selection of ROMs by the multiplier 532a is controlled by the ROM_SEL signal 510b. The 256 coefficients in each of the ROMs 820a–e can be addressed through an 8-bit address bus 510c.

The main function blocks of a control module 810 is shown in FIG. 8 which includes a master clock 812 at 24.576 MHZ, an address counter 814, and logic control gates 816 that produce addresses that are transmitted through the bus 510c. The address counter 814 has 9 address bits to address 512 coefficients in the 256-coefficient ROMs. The highest address bit, A8, is used as the ROM_SEL signal 510b to select ROMs and the lower bits, A7, A6, . . . , A0, are used to address the FIR coefficients.

Specifically, the lower address bits, A7, A6, . . . , A0, can be used to directly address the addresses 000h–0FFh in ROMs 820a, 820b, 820c, 820d, and 820e, respectively. The remaining addresses from 100h to 1FFh in the ROMs can be addressed by using the inversion of the lower address bits, A7, A6, . . . , A0 and swapping the coefficients between two reversely imaged ROMs, i.e., ROMs 820a and 820e, ROMs 820b and 820d. For the ROM 820c, the order of the coefficients can be simply reversed.

The above ROM configuration reduces the amount of needed memory for storing the FIR coefficients and thus reduce the circuit size and cost. The ROM size can be further reduced in the above ROM configuration by assigning different data width to ROMs based on the data range in each ROM. Thus, different ROMs can be configured to have different sizes. Large coefficients can be stored in large ROMs and small coefficients can be stored in small ROMs. This provides significant memory savings, especially for FIR filters having a large variation from the center coefficients to the side coefficients.

For the example shown in FIGS. 5 and 8, the coefficients in FIG. 5A are allocated in 5 ROMS in the following coefficient range:

ROM0: [−279, 512];

ROM1: [−2128, 3460];

ROM2: [−6443, 31119];

ROM3: [−1900, 3347];

ROM4: [−717, 449]. Accordingly, the widths of ROMs are, including the sign bits, 11 bits for ROM0 and ROM4, 13 bits for ROM1 and ROM3, and 16 bits for ROM2.

Figure 9A:
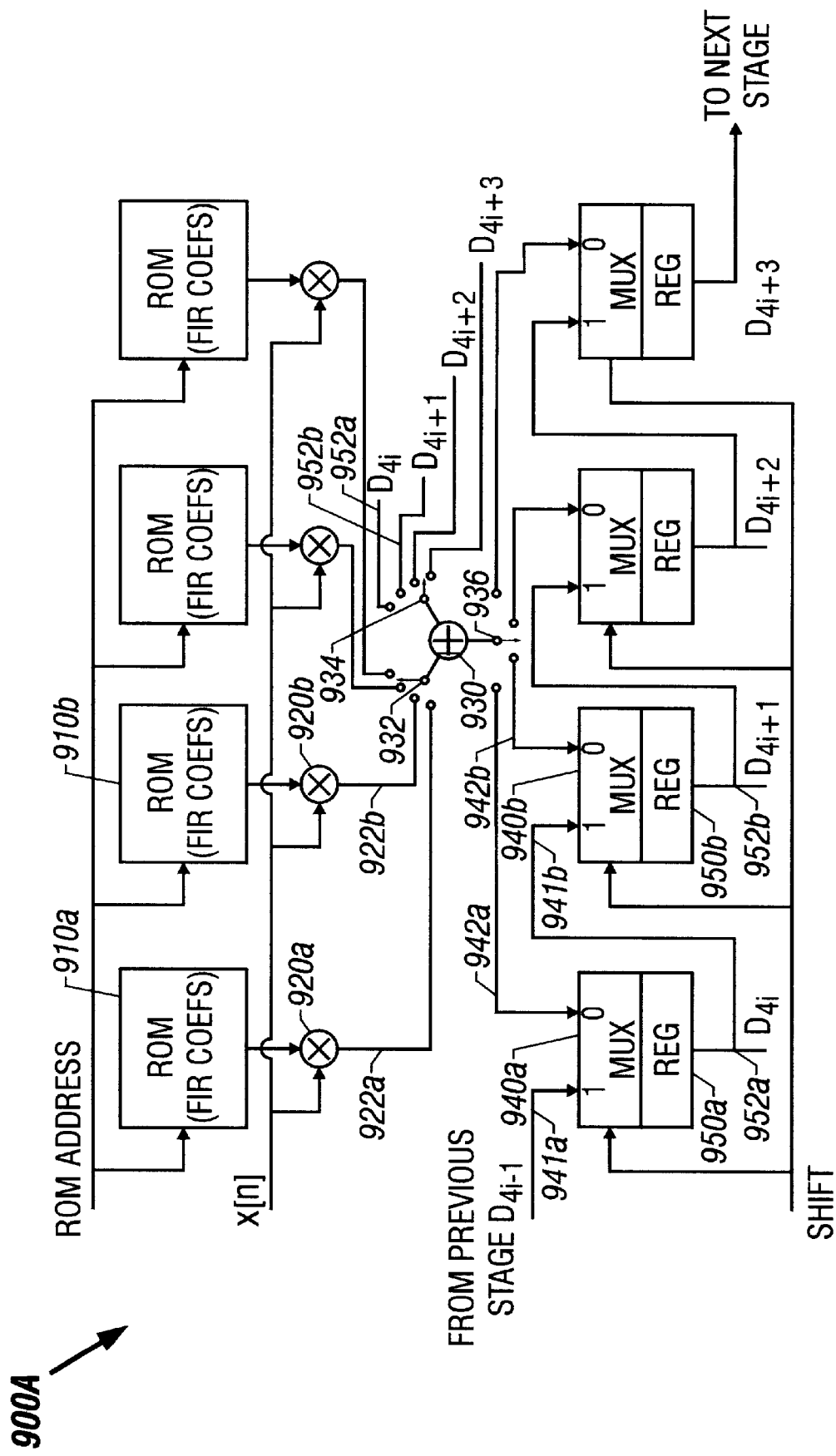
FIG. 9A is a diagram showing another embodiment that multiple registers share one accumulator.

FIG. 9A shows an alternative embodiment 900a to the embodiment 600 in which an accumulator is shared by multiple registers to form multiple processing stages. Multiple ROMs such as 910a, 910b are used to store different FIR coefficients of N FIR coefficients for different processing stages. For example, the ROM 910a, multiplier 920a, multiplexer 940a and register 950a correspond to one processing stage $D_{4i}$ and the ROM 910b, multiplier 920b, multiplexer 940b and register 950b correspond to an adjacent processing stage $D_{4i+1}$. Input terminals 932, 934 and the output terminal 936 of an accumulator 930 are connected to switches so that the accumulator 930 can be connected to two or more different processing stages at different times during one input data sample period. The operation of the switches for the accumulator 930 are synchronized by a clock signal at a rate faster than the input sampling rate of the input x(n).

The example in FIG. 9A shows four processing stages $D_{4i}$, $D_{4i+1}$, $D_{4i+2}$, and $D_{4i+3}$ share the accumulator 930. The clock signal for controlling the switching of the accumulator 930 is four times faster than the input sampling rate. In one input data sample period, the terminals 932, 934 and 936 of the accumulator 930 are respectively connected to 922a, 952a, and 942a to perform one accumulation for the processing stage $D_{4i}$ corresponding to ROM 910a. Next, the terminals 932, 934 and 936 of the accumulator 930 are respectively switched to 922b, 952b, and 942b to perform one accumulation on the same input data sample for the processing stage $D_{4i+1}$ corresponding to ROM 910b. This continues until an accumulation on the same input data sample in the processing stage $D_{4i+3}$ is completed. At this time, the above process repeats again to perform accumulations for all four processing stages on the next input data sample. After each processing stage completes M accumulations, the multiplexers (e.g., 940a, 940b, etc.) perform a shift operation in response to a SHIFT command so that the accumulated result in a processing stage is shifted to a succeeding stage.

Only one accumulator 930 is shown in FIG. 9A. Similar to the embodiment 500 of FIG. 5, two or more such shared accumulators may be implemented. In addition, the FIR coefficients in a ROM may be shared by two different processing stages if the FIR coefficients are symmetric.

Figure 9B:
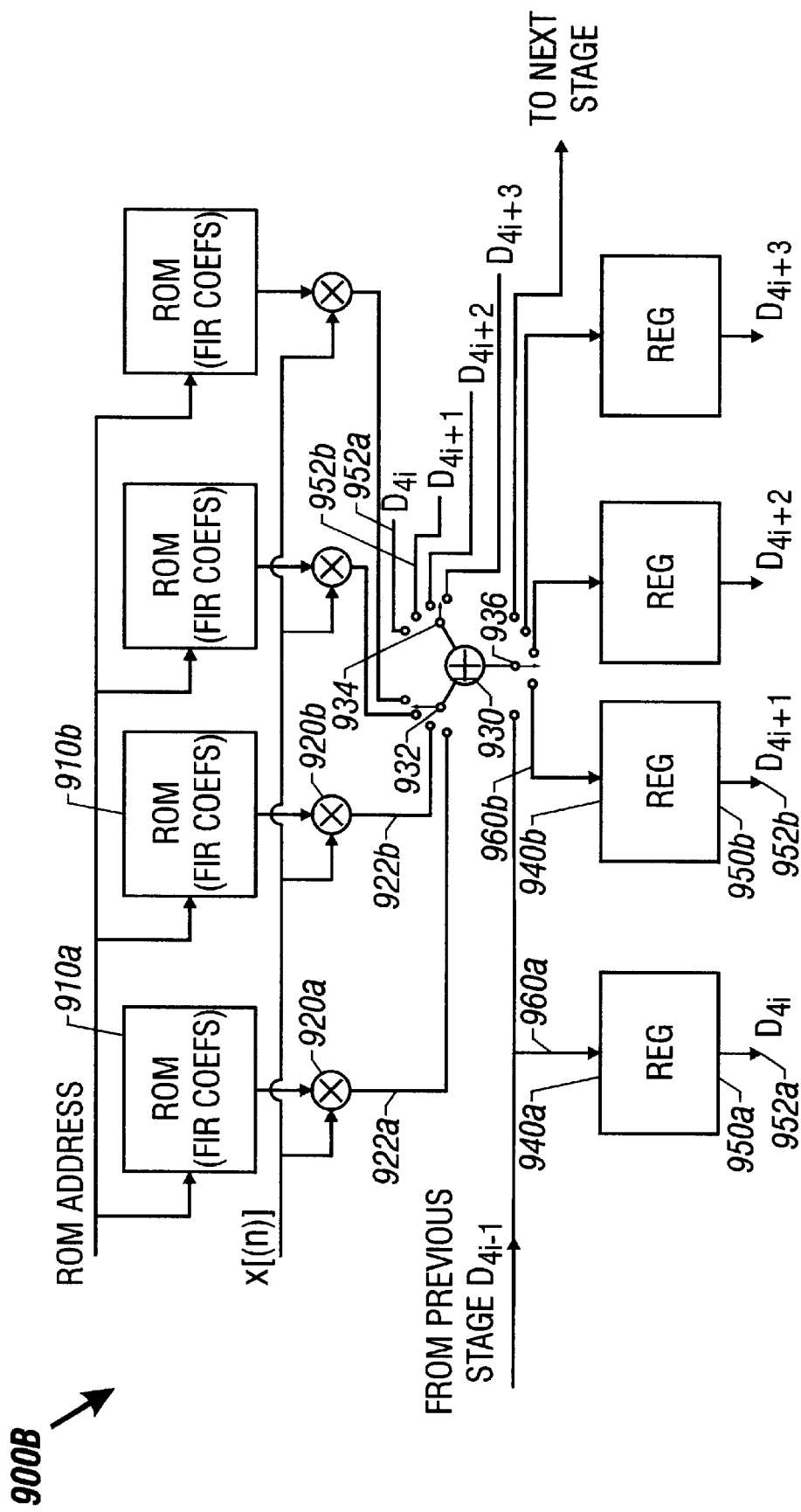
FIG. 9B is a diagram showing an alternative embodiment to the circuit shown in FIG. 9A.

FIG. 9B shows an alternative embodiment 900b which eliminates the multipliers in FIG. 9A. The registers are connected to directly receive data from the accumulator 930. This circuit operates essentially the same way as the circuit 900a except that the shift operations are accomplished by properly switching the input terminal 934 of the accumulator 930. For example, assume a shift operation is issued after M accumulations and the processing stage $D_{4i+1}$ begins to perform the next M accumulations. As in the circuit 900a of the FIG. 9A, the terminals 932 and 936 are switched to terminals 922b and 960b, respectively. Unlike in the circuit 900a, the terminal 934 is first switched to the output terminal 952a to shift the accumulated result in the register 950a to the accumulator 930 to perform the first accumulation in the next M accumulations. Subsequently, the terminal 934 is switched to the terminal 952b of the register 950b for the next (M−1) accumulations. This configuration eliminates an extra clock cycle that is needed in the circuit 900a of FIG. 9A for a shift operation.

Figure 10:
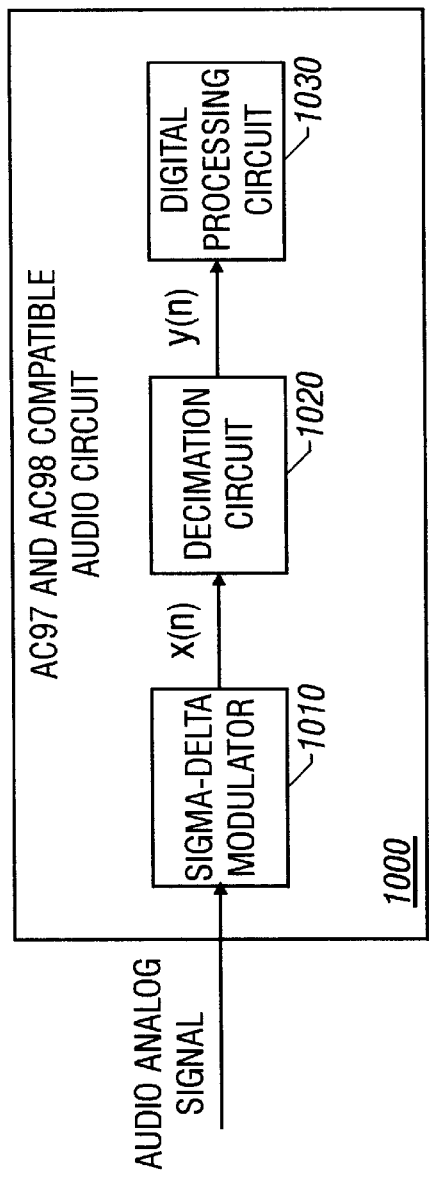
FIG. 10 is a block diagram showing an audio circuit having an analog-to-digital converter based on a decimation circuit according to one embodiment of the invention.

The above-disclosed decimation circuits may be used in analog-to-digital converters for AC97 and AC98 compatible digital audio circuits. FIG. 10 shows the functional blocks of such an audio circuit 1000. A sigma-delta modulator 1010 converts an analog audio signal into a low-bit oversampled data x(n), e.g., at 128 times oversampling. A decimation circuit 1020, such as any one of the above decimation filters, converts the oversampled low-bit input x(n) into down-sampled high-bit output y(n). Digital signal processing circuit 1030 further processes the data y(n).

Figure 11:
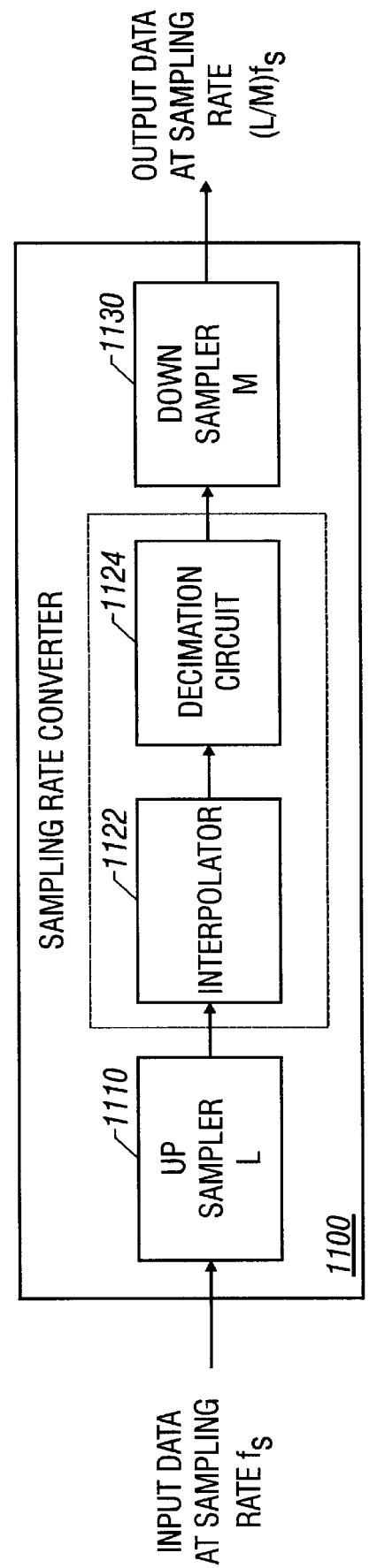
FIG. 11 is a block diagram showing a sampling rate converter based on a decimation filter according to one embodiment of the invention.

FIG. 11 shows a sampling rate converter 1100 using a decimation circuit having a decimation filter 1124 and down sampler 1130 according to the invention. An input data is first up sampled using an up-sampler 1110 by a factor of L and then interpolated by an interpolator 1122. Circuits and operations of the up-sampler 1110 and interpolator 1022 are well known. Next, the data is decimated by a factor of M using the decimation filter 1120 and the down sampler 1130. In actual implementations, the interpolator 1122 and the decimation filter 1124 may often be integrated together as a low-pass filter 1120. By adjusting the ratio L/M, different output sampling rates can be achieved. This sampling rate converter can be used in a range of devices such as ADCs and modems.

Although a few embodiments have been described, various modifications and enhancements may be made without departing from the scope and spirit of the the following claims.

What is claimed is:

1. An electronic circuit, comprising:
   an input terminal operable to receive a series of input data samples at an input sampling rate;
   at least one memory unit configured to store a specified set of digital filtering coefficients which are designed to perform a filtering operation on said input data samples; and
   a plurality of signal processing stages each connected to said input terminal and said memory unit and configured to include a multiplier operable to multiply an input data sample by a selected coefficient in said memory unit, an accumulator connected to receive an output from said multiplier and configured to perform accumulations, and a register connected to receive accumulated data from said accumulator or data from a source outside said processing stage and to feed said accumulated data back to said accumulator for a subsequent accumulation,
   wherein said signal processing stages are further interconnected in series for shifting an accumulated result from one processing stage to a succeeding processing stage after a specified number of accumulations are completed in each processing stage in response to a shift command.

2. A circuit as in claim 1, wherein each of said processing stages comprises a multiplexer connected between said accumulator and said register to route said output from said accumulator when said shift command does not issue a shift operation and to route said data from said source outside said processing stage to said register when said shift command issues a shift operation.

3. A circuit as in claim 2, wherein one input terminal of a multiplexer in a first processing stage of said processing stages is connected to an output terminal of a register in a second processing stage preceding said first processing stage for receiving an accumulated result from said second processing stage.

4. A circuit as in claim 2, wherein one input terminal of a multiplexer in a first processing stage among said processing stages is connected to an output terminal of an accumulator in a second processing stage among said processing stages that precedes said first processing stage for receiving an accumulated result from said second processing stage.

5. A circuit as in claim 1, further comprising a sampling element connected to an output of a last processing stage of said plurality of processing stages, said sampling element operating to sample said output of said last processing stage when a shift operation is issued by said shift command so as to produce decimated output samples at an output rate less than said input sampling rate.

6. A circuit as in claim 5, further comprising a quantizer having a signal-receiving terminal to receive an analog signal and a data-output terminal connected to said input terminal, said quantizer configured to sample said analog signal at said input sampling rate that is higher than a Nyquist frequency of said analog signal to produce said input data samples, wherein said output rate of said sampling element is equal to or greater than said Nyquist frequency.

7. A circuit as in claim 6, wherein said quantizer includes a sigma-delta modulator.

8. A circuit as in claim 5, further comprising an input sampling element receiving a first signal at a first sampling rate less than said input sampling rate and operating to sample said first signal at said input sampling rate to produce said input data samples to said input terminal, whereby said circuit effects a conversion from said first input sampling rate to said output sampling rate.

9. A circuit as in claim 1, wherein said memory unit includes at least two memory cells that store different digital filtering coefficients, and further comprising at least one memory-cell multiplexer having two input terminals respectively coupled to select digital filtering coefficients from said at least two memory cells, wherein at least one signal processing stage is coupled to receive digital filtering coefficients from said at least one memory-cell multiplexer.

10. A circuit as in claim 9, further comprising a control circuit that controls said at least one memory-cell multiplexer to select digital filtering coefficients from one of said least two memory cells.

11. A circuit as in claim 1, wherein said filtering coefficients are configured in such a way that a ratio of a number of said filtering coefficients and said specified number of accumulations is an integer and a number of said processing stages is equal to said integer.

12. A circuit as in claim 1, wherein each of said processing stages further comprises at least one additional register connected to said accumulator, said accumulator operating to complete at least two accumulations for each input data sample in response to a control clock signal at a rate higher than said input sampling rate.

13. A circuit as in claim 1, wherein said multiplier in each processing stage includes a digital shifter.

14. A circuit as in claim 1, wherein said accumulator in each processing stage is configured to further receive a sign bit indicative of a sign of said input data sample from said input terminal, said accumulator operable to perform either an addition or substraction according to a value of said sign bit.

15. An electronic circuit, comprising:
    an accumulator configured to have first and second input terminals to perform an accumulation operation on input data from said first and second input terminals to produce accumulated data;
    a first multiplexer having a first input terminal connected to said accumulator to receive said accumulated data and a second input terminal to receive an external input data, wherein said first multiplexer ordinarily is configured to transmit said accumulated data at said first input terminal unless a shift command signal that controls said first multiplexer instructs to route said external input data at said second input terminal;
    a first register connected to receive data from said first multiplexer;
    a second multiplexer having first and second input terminals connected to receive data associated with data from said first register and data associated with said accumulated data from said accumulator;
    a second register connected to receive data from said second multiplexer; and
    a signal channel coupled to transmit data in said second register to said second input terminal of said accumulator for accumulation,
    wherein said first and second multiplexers are synchronized to respectively route signals either at said first terminals or at said second terminals of said first and second multiplexers to said first and second registers.

16. A circuit as in claim 15, wherein said accumulator is configured to perform a plurality of accumulations between two sequential transmissions of data at said second terminals of said first and second multiplexers to said first and second registers, respectively.

17. A circuit as in claim 15, wherein said accumulator is configured to perform at least two accumulations for each of input data sample at said first terminal of said accumulator.

18. A circuit as in claim 15, wherein said accumulator is configured to further receive a sign bit indicative of a sign of said input data at said first input terminal, said accumulator operable to perform either an addition or substraction of said input data from said first and second input terminals according to a value of said sign bit.

19. A circuit as in claim 15, further comprising:
    at least two memory cells that store different digital filtering coefficients; and
    at least one memory-cell multiplexer having two input terminals respectively coupled to select digital filtering coefficients from said at least two different memory cells,
    wherein said accumulator is coupled to receive digital filtering coefficients from said at least one memory-cell multiplexer.

20. A circuit as in claim 19, further comprising a control circuit that controls said at least one memory-cell multiplexer to select digital filtering coefficients from one of said at least two different memory cells.

21. An electronic circuit, comprising:
    a memory unit operable to store a specified set of digital filtering coefficients configured to produce a specified frequency response;
    a multiplier having a first input terminal to receive a series of input data samples at a first data rate and a second input terminal connected to said memory unit, said multiplier operable to multiply an input data sample by a selected coefficient in said memory unit to produce a multiplier output;
    an accumulator having a first input terminal connected to said multiplier for receiving said multiplier output and a second input terminal for receiving another input, said accumulator operating to perform an accumulation operation on said multiplier output and said another input to produce accumulated data;
    a first multiplexer having a first input terminal connected to said accumulator to receive said accumulated data and a second input terminal to receive an additional input data;
    a first register connected to receive data from said first multiplexer;
    a second multiplexer having first and second input terminals connected to receive data associated with data from said first register and data associated with said accumulated data from said accumulator;
    a second register connected to receive data from said second multiplexer; and
    a signal channel coupled to transmit data in said second register to said second input terminal of said accumulator for accumulation,
    wherein said first and second multiplexers are synchronized to respectively route signals either at said first terminals of said first and second multiplexers at said first data rate or at said second terminals of said first and second multiplexers to said first and second registers at a second data rate that is less than said first data rate.

22. A circuit as in claim 21, wherein said accumulator is configured to perform at least two accumulations for each of input data sample at said first terminal of said accumulator.

23. A circuit as in claim 21, wherein said multiplier includes a digital shifter.

24. A circuit as in claim 21, wherein said accumulator is configured to further receive a sign bit indicative of a sign of an input data sample to said multiplier, said accumulator operable to perform either an addition or substraction according to a value of said sign bit.

25. A circuit as in claim 21, further comprising a sampling element connected to said first input terminal of said second multiplexer to receive input data thereto, said sampling element synchronized to said first and second multiplexers and configured to sample said input data to said first input terminal at said second data rate.

26. A circuit as in claim 21, further comprising a quantizer having a signal-receiving terminal to receive an analog signal and a data-output terminal connected to produce said input data samples to said multiplier, said quantizer configured to sample said analog signal at said first data rate that is higher than a Nyquist frequency of said analog signal to produce said input data samples, wherein said second data rate is equal to or greater than said Nyquist frequency.

27. A circuit as in claim 26, wherein said quantizer includes a sigma-delta modulator.

28. A circuit as in claim 25, further comprising an input sampling element receiving initial data samples at an initial data rate less than said first data rate and operating to sample said initial data samples at said first data rate to produce said input data samples to said multiplier, whereby said circuit effects a conversion from said initial data rate to said second data rate.

29. A circuit as in claim 21, wherein said memory unit includes at least two memory cells that store different digital filtering coefficients of said specified set, and further comprising at least one memory-cell multiplexer having two input terminals respectively coupled to select digital filtering coefficients from said at least two memory cells, wherein said accumulator is coupled to receive digital filtering coefficients from said at least one memory-cell multiplexer.

30. A circuit as in claim 29, further comprising a control circuit that controls said at least one memory-cell multiplexer to select digital filtering coefficients from one of said at least two memory cells.

31. An electronic circuit, comprising:
    an input terminal operable to receive a series of input data samples at an input sampling rate;
    at least one memory unit configured to store a specified set of digital filtering coefficients which are designed to perform a filtering operation on said input data samples;
    a first signal processing stage connected to said input terminal and said memory unit and configured to include a first multiplier operable to produce an output at an output terminal by respectively multiplying said input data samples and a first group of said filtering coefficients, a first multiplexer having a first input terminal for receiving data from a source outside said first processing stage and a second input terminal for receiving a first accumulated data based on said output of said first multiplier, and a first register having an input terminal connected to receive data from said first multiplexer and an output terminal;
    a second signal processing stage connected to said input terminal and said memory unit and configured to include a second multiplier operable to produce an output at an output terminal by respectively multiplying said input data samples and a second group of said filtering coefficients, a second multiplexer having a first input terminal connected to said output terminal of said first register and a second input terminal for receiving a second accumulated data based on said output of said second multiplier, and a second register having an input terminal connected to receive data from said second multiplexer and an output terminal;

an accumulator having a first input terminal for receiving data produced by said first and second multipliers and a second input terminal for receiving data from said first and second registers, said accumulator operable to produce said first accumulated data according to said output from said first multiplier and data from said first register and said second accumulated data according to said output from said second multiplier and data from said second register; and first, second, and third switches respectively connected to said first, second input terminals and said output terminal of said accumulator and synchronized according to a switch clock signal at a rate at at least twice as fast as said input sampling rate to respectively switch between said output terminals of said first and second multipliers, between said output terminals of said first and second registers, and between said second terminals of said first and second multiplexers, wherein said first and second multiplexers are synchronized by a shift command to transmit said second input terminal to said output terminal unless said shift command issues a shift operation, and wherein said first, second and third switches sequentially connect said accumulator to said first processing stage to produce said first accumulated data based on a first input data sample from said input terminal and connected said accumulator to said second processing stage to produce said second accumulated data based on said first input data sample during a period in which said first input data sample is available.

32. A circuit as in claim 31, wherein said first and second multiplexers each transmit said first input terminal to said output terminal after a specified number of accumulations are completed in said first and second processing stages in response to said shift command so that an accumulated result from said specified number of accumulations in said first processing stage is shifted into said second register of said second processing stage.

33. A circuit as in claim 32, further comprising a sampling element connected to said output of said second register and configured to sample said output when a shift operation is issued by said shift command so as to produce decimated output samples at an output rate less than said input sampling rate.

34. A circuit as in claim 31, wherein said memory unit includes at least two memory cells that store different digital filtering coefficients of said specified set, and further comprising at least one memory-cell multiplexer having two input terminals respectively coupled to select said first group of said filtering coefficients from said at least two memory cells, wherein said first processing stage is coupled to said at least one memory-cell multiplexer to receive said first group of said filtering coefficients.

35. A circuit as in claim 34, further comprising a control circuit that controls said at least one memory-cell multiplexer to select said first group of said filtering coefficients from said least two memory cells.

36. An electronic circuit, comprising:
an input terminal operable to receive a series of input data samples at an input sampling rate;
at least one memory unit configured to store a specified set of digital filtering coefficients which are designed to perform a filtering operation on said input data samples;

a first signal processing stage connected to said input terminal and said memory unit and configured to include a first multiplier operable to produce an output at an output terminal by respectively multiplying said input data samples and a first group of said filtering coefficients, a first register having an output terminal and an input terminal for receiving data from a source outside said first processing stage and a first accumulated data based on said output of said first multiplier;

a second signal processing stage connected to said input terminal and said memory unit and configured to include a second multiplier operable to produce an output at an output terminal by respectively multiplying said input data samples and a second group of said filtering coefficients, a second register having an output terminal and an input terminal for receiving a second accumulated data based on said output of said second multiplier;

an accumulator having a first input terminal for receiving data produced by said first and second multipliers and a second input terminal for receiving data from said first and second registers, said accumulator operable to produce said first accumulated data according to said output from said first multiplier and data from said first register and said second accumulated data according to said output from said second multiplier and data from said second register; and first, second, and third switches respectively connected to said first, second input terminals and said output terminal of said accumulator and synchronized according to a switch clock signal at a rate at at least twice as fast as said input sampling rate to respectively switch between said output terminals of said first and second multipliers, between said output terminals of said first and second registers, and between said input terminals of said first and second registers, wherein said first, second and third switches sequentially connect said accumulator to said first processing stage to produce said first accumulated data based on a first input data sample from said input terminal and connected said accumulator to said second processing stage to produce said second accumulated data based on said first input data sample during a period in which said first input data sample is available.

37. A circuit as in claim 36, wherein said memory unit includes at least two memory cells that store different digital filtering coefficients of said specified set, and further comprising at least one memory-cell multiplexer having two input terminals respectively coupled to select digital filtering coefficients from said at least two memory cells, wherein said first multiplier is coupled to said at least one memory-cell multiplexer to receive said first group of said filtering coefficients.

38. A circuit as in claim 37, further comprising a control circuit that controls said at least one memory-cell multiplexer to select said first group of said filtering coefficients from said least two memory cells.

39. A method for filtering signals, comprising:
sampling an analog signal to obtain input data samples at an input sampling rate;
storing a specified set of digital filtering coefficients which are designed to perform a filtering operation on said input data samples;
multiplying an input data sample by selected filtering coefficients in a plurality of processing stages to respectively produce multiplied data samples;

using said multiplied data samples to respectfully perform accumulations in said processing stages;

feeding either an external input data sample or an accumulated data from the accumulation in each processing stage back to the accumulation so as to perform a subsequent accumulation in each processing stage; and connecting said processing stages with one another in series to shift an accumulated result from one processing stage to a succeeding processing stage after a specified number of accumulations are completed in each processing stage in response to a shift command.

40. A method as in claim 39, further comprising generating a filtered output data sample upon each shift between two adjacent processing stages to produce filtered output data samples at an output sampling rate that is less than said input sampling rate.

41. A method as in claim 39, further comprising:
implementing at least two memory cells to store different digital filtering coefficients of said specified set of digital filtering coefficients; and
coupling at least one processing stage to said at least two memory cells to receive different digital filtering coefficients therefrom for accumulatons in said at least one processing stage.

42. A method as in claim 41, further comprising using a multiplexer to couple said at least one processing stage to said at least two memory cell.

43. A method as in claim 39, further comprising using a sign bit to control each accumulation to be either an addition or a substration.

44. A method as in claim 39, wherein each accumulated result is fed back for a subsequent accumulation when said shift command does not issue a shift operation and said external input data sample is fed back for a subsequent accumulation when said shift command issues a shift operation.

45. A method as in claim 39, wherein said external input data for one processing stage is associated with an accumulated result from a preceeding processing stage.

46. A method as in claim 39, wherein a ratio of a number of said filtering coefficients and said specified number of accumulations is an integer and a number of said processing stages is equal to said integer.

47. A method as in claim 39, further comprising performing at least two accumulations for each input data sample in response to a control clock signal at a rate higher than said input sampling rate.

48. A method for filtering signals, comprising:
using an accumulator, which has first and second input terminals, to perform an accumulation operation on input data from said first and second input terminals to produce accumulated data;

connecting a first input terminal of a first multiplexer to said accumulator to receive said accumulated data;

using a second input terminal of said first multiplexer to receive an external input data;

using said first multiplexer to transmit said accumulated data at said first input terminal unless a shift command signal controls said first multiplexer to route said external input data at said second input terminal;

connecting a first register to receive data from said first multiplexer;

connecting a second multiplexer having first and second input terminals to receive data associated with data from said first register and data associated with said accumulated data from said accumulator;

connecting a second register to receive data from said second multiplexer;

feeding data in said second register to said second input terminal of said accumulator for accumulation; and synchronizing said first and second multiplexers to respectively route signals either at said first terminals or at said second terminals of said first and second multiplexers to said first and second registers.

49. A method as in claim 48, further comprising:
controlling said accumulator to perform a plurality of accumulations between two sequential transmissions of data at said second terminals of said first and second multiplexers to said first and second registers, respectively.

50. A method as in claim 48, further comprising controlling said accumulator to perform at least two accumulations for each of input data sample at said first terminal of said accumulator.

* * * * *